United States Patent [19]
Peyrotte et al.

[11] Patent Number: 5,565,820
[45] Date of Patent: Oct. 15, 1996

[54] PULSE WIDTH POWER SUPPLY MODULATOR

[75] Inventors: Christian Peyrotte, Toulouse; Philippe Vidal, Blagnac, both of France

[73] Assignee: Alcatel Espace, Nanterre Cedex, France

[21] Appl. No.: 499,400

[22] Filed: Jul. 7, 1995

[30] Foreign Application Priority Data

Jul. 8, 1994 [FR] France ................................ 94 08492

[51] Int. Cl.⁶ .............................. H02M 7/00; H03K 7/08
[52] U.S. Cl. ...................... 332/110; 323/224; 323/282; 323/288; 323/326; 323/350; 323/351
[58] Field of Search ............................. 332/110; 323/223, 323/224, 225, 282, 283, 288, 325, 326, 349, 350, 351

[56] References Cited

U.S. PATENT DOCUMENTS

| | | | |
|---|---|---|---|
| 4,417,197 | 11/1983 | Schwarz | 323/272 |
| 4,672,303 | 6/1987 | Newton | 323/285 |
| 4,847,546 | 7/1989 | Bobier et al. | 323/282 |
| 4,931,716 | 6/1990 | Jovanovic | 323/285 |
| 4,947,311 | 8/1990 | Peterson | 323/350 |
| 5,105,144 | 4/1992 | Trump | 323/283 |
| 5,159,297 | 10/1992 | Tateno | 333/104 |

FOREIGN PATENT DOCUMENTS

| | | |
|---|---|---|
| 0060336A2 | 9/1982 | European Pat. Off. . |
| 0460573A1 | 12/1991 | European Pat. Off. . |
| 0460571A1 | 12/1991 | European Pat. Off. . |
| 0507398A1 | 10/1992 | European Pat. Off. . |

OTHER PUBLICATIONS

*IEEE Transactions on Power Electronics*, vol. 6, No. 1, Jan. 1991, New York, US pp. 127–140, D. Maksimovic et al, "A General Approach to Synthesis and Analysis of Quasi–Resonant Converters".

*Soviet Inventions Illustrated*, Section E1, Week 8418, 13 Jun. 1984, Derwent Publications, Ltd, London, Class U23, AN 84–111850 & SU–A–1 029 392 (Rost Med Inst) 15 Jul. 1983.

*PESC '88 Record, 19th Annual IEEE Power Electronics Specialists Conference*, Apr. 1988, Doshisha University, Kyoto, Japan, pp. 1024–1030, D. M. Divan, "Diodes as pseudo active elements in high frequency dc/dc converters".

*Patent Abstracts of Japan*, vol. 5, No. 7 (E–4) (679) 17 Jan. 1981 & JP–A–55 136 868 (Fuji Denki Seizo K. K.) 25 Oct. 1980.

*Primary Examiner*—Siegfried H. Grimm
*Attorney, Agent, or Firm*—Sughrue, Mion, Zinn, Macpeak & Seas

[57] ABSTRACT

A pulse width modulation type power supply modulator capable of operating at high switching frequencies (>10 MHz) is achieved by eliminating resonant circuits which limit the maximal switching frequency. The modulator includes a power circuit including a power transistor, a first control circuit connected to the gate of the power transistor and a second control circuit connected to the output of the power circuit. In a preferred embodiment the active components are isolated from each other by areas of metalization on a printed circuit to minimize unwanted coupling and the electrical lengths are minimized.

6 Claims, 2 Drawing Sheets

PULSE WIDTH POWER SUPPLY MODULATOR

BACKGROUND OF THE INVENTION

1. Field of the Invention

The field of the invention is that of power modulators and in particular modulators that modulate the power supply of a radio-frequency (RF) amplifier.

The invention is more precisely concerned with pulse width modulators (PWM) for modulating the power supply of an RF amplifier to apply amplitude modulation.

Another field of the invention is that of energy conversion, in which field a high switching frequency (>10 MHz) is required.

The PWM of the invention is well suited to applications including radar, active antennas, sonar, high bit rate telecommunications and many others thanks to the very fast response time of the modulator of the invention.

2. Description of the Prior Art

The person skilled in the art knows of power converter modulators that are capable of operating at high switching frequencies.

These prior art modulators use the principle of resonance to obtain relatively high switching frequencies.

However, because they rely on resonance, these prior art switch mode modulators are subject to an upper frequency limit (>1 MHz). Higher switching frequencies (5 MHz to 10 MHz) are advantageous for the power supplies of RF amplifiers in conditions which lend themselves to optimum energy efficiency.

Also because of resonance, the switching frequency of the transistors is dependent on the input voltage and on variations in the load. This restricts applications in telecommunications, which become problematical because the frequency spectrum of the various signals must be known. Variations in unwanted frequency components make it difficult to filter them out and the noise power varies with the switching frequency.

A second problem is that all existing implementations use power components and transfer techniques suited to low frequencies (a few tens of MHz), which limits the application for high bands.

SUMMARY OF THE INVENTION

To overcome the drawbacks of the prior art, the invention proposes a pulse width modulation type power supply modulator adapted to operate at high switching frequencies, including:

- a power circuit including at least one power transistor,
- a first control circuit connected to the gate of said power transistor, and
- a second control circuit connected to the output of said power circuit,
- wherein said power circuit includes n power transistors each driven by a control signal supplied by a respective control circuit at a respective frequency, said frequencies being of the same amplitude but of different phases, so as to satisfy the equation:

$$F_{i+1} = F_i + \frac{\pi}{n}, i = 1, \ldots n-1,$$

the result of which is a switching frequency given by the equation:

$$F_{n+1} = nF_1.$$

In one embodiment of the invention n=2 in order to satisfy the equation:

$$F2 = F1 + \frac{\pi}{n}, F_3 = 2F_1 = 2F_2,$$

the result of which is to double the switching frequency.

In an advantageous embodiment of the invention, the modulator of the invention does not include any resonant components. In a different embodiment of the invention the modulator includes as few resonant components as possible.

In accordance with one advantageous feature of the invention, the modulator of the invention is wired on a double-sided polyimide substrate printed circuit. In accordance with another feature of the invention, loops in which currents are switched are minimized. In accordance with another feature of the invention, the modulator of the invention is implemented in surface mount components (SMC). In accordance with another preferred feature of the invention, the electrical lengths that constitute the circuit are minimized.

In accordance with another feature of the invention, power and switching transistors are isolated from each other on a printed circuit by areas of metalization on said circuit.

Other features and advantages of the invention will emerge from the following detailed description given with reference to the appended drawings.

DETAILED DESCRIPTION OF THE PREFERRED EMBODIMENTS

The drawings are given by way of non-limiting example to illustrate the principle of the invention and a few variants thereof. The same reference symbols always identify the same components in all the figures.

Figure 1:
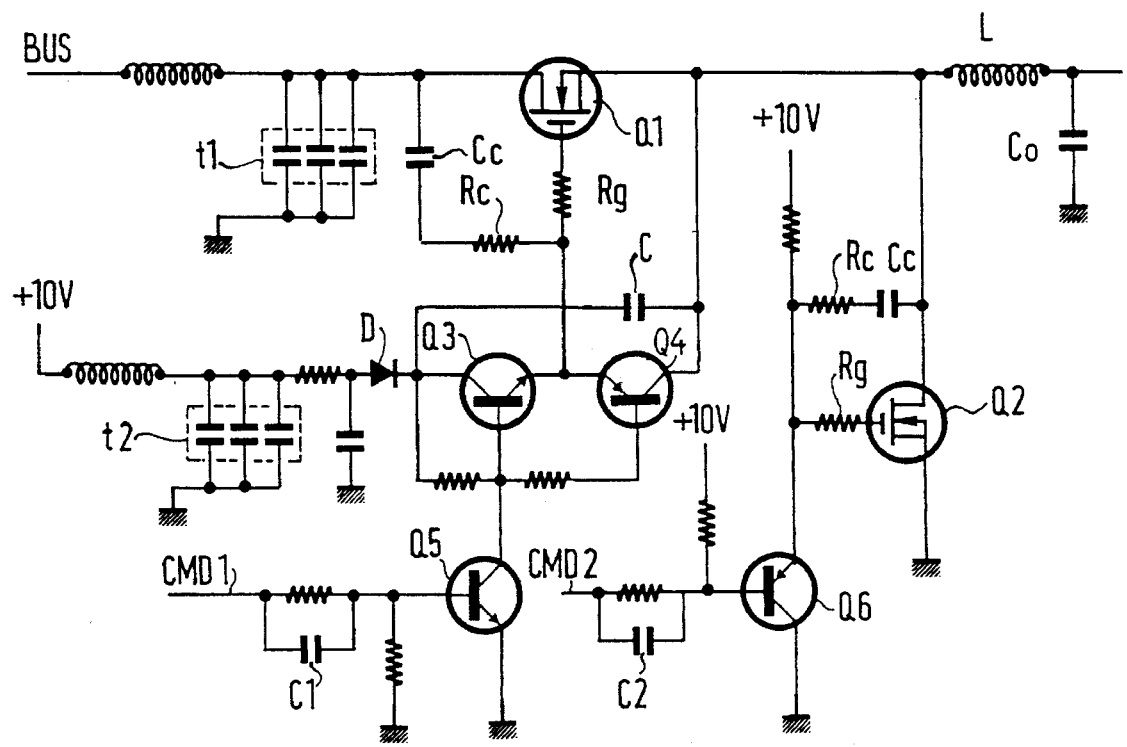
FIG. 1 is a circuit schematic of one example of a modulator circuit in accordance with the invention.

FIG. 1 shows one example of a switched mode modulator circuit of the invention. The various functional parts of the circuit are described first.

The power transistor Q1 modulates the electric power supplied by the bus under the control of a prior art bootstrap circuit operation of which is controlled by a first external control signal $CMD_1$ applied to a first control circuit. The output of the modulator circuit is chopped by a switching circuit under the control of a second external control signal $CMD_2$ applied to a second control circuit.

The MOSFET used being of the N channel type, the gate-source voltage (Vgs) must be greater than the transistor conduction threshold voltage (V.threshold) so that the latter is turned on. The conduction threshold voltage is in the order of 2 V to 3 V. The transistor is turned off by making Vgs≦0 V.

When the transistor Q1 is turned on its source potential rises to the bus voltage (V.bus). Its gate voltage must then be at V.bus+αV.Threshold (α≧2).

The switching is therefore obtained by means of a bootstrap configuration voltage increasing circuit in the gate circuit of the MOSFET.

Figure 2:
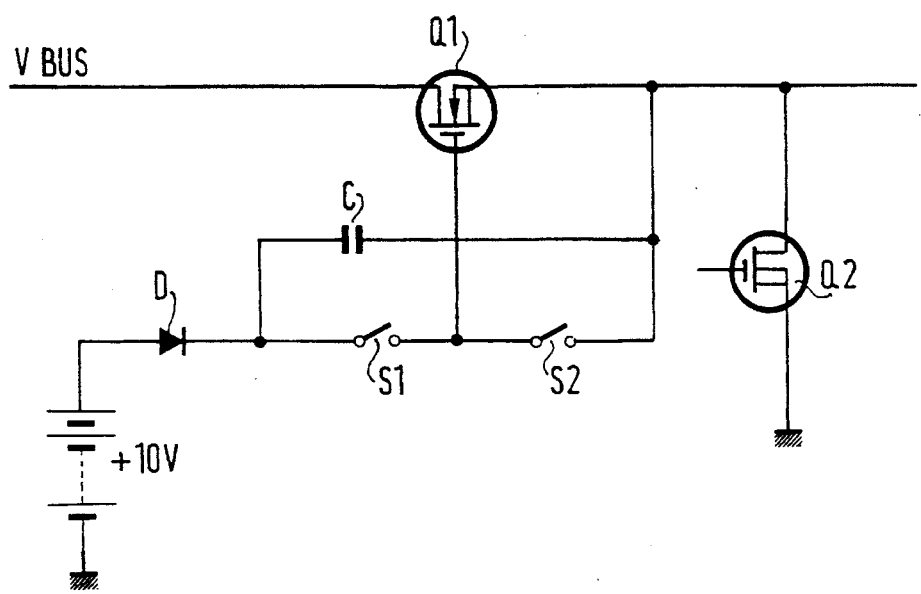
FIG. 2 is a circuit schematic of a prior art bootstrap circuit used in the circuit from FIG. 1.

FIG. 2 shows a prior art bootstrap circuit with the aim of assisting an understanding of its operation in the FIG. 1 circuit.

With S2 and Q2 saturated, the diode D conducts and the reservoir capacitor C charges to +10 V. When S2 is turned on Vgs of Q1 is forced to 0 V which turns off Q1. This state is stable, with Q1 open and Q2 turned on.

With S2 and Q2 open and S1 turned on, the capacitor C is in parallel with the gate-source junction of Q1, biasing the latter positive and so turning on Q1. The source potential of Q1 rises to the BUS voltage. Via capacitor C, this rise in voltage turns off the diode D. The cathode-potential rises to V.bus+10 V. This state is stable with Q1 saturated and Q2 turned off.

The capacitance of the capacitor C must be at least ten times Cgs if it is not to lose charge during switching. The diode D must have a very short recovery time if it is to have no influence over the rise in the source potential of Q1.

The switches S1 and S2 are the fast rise time transistors Q3 and Q4.

These transistors are driven by the transistor Q5, the collector voltage of which rises to V.bus+10 V.

To take full advantage of the reverse voltage at Q5, the latter is biased negative (turned off) via C1 when the control signal CMD1 falls to zero.

The networks Rc, Cc and Rg damp oscillation arising in the MOSFETs on switching. This oscillation is due to the spurious inductance and capacitance of the component encapsulation and the printed circuit connections.

The bus input filter ($t_1$) and +10 V power supply filter ($t_2$) comprise a plurality of capacitors in parallel to apply filtering over the widest possible frequency band.

A preferred embodiment of the invention using the FIG. 1 schematic will now be described in terms of the performance required of the various components of the circuit and with reference to specific commercially available components).

The components must allow for the current, voltage and switching speed constraints imposed by this application.

These constraints are:

Output voltage up to 28 V.

BUS input voltage up to 40 V.

Output current >1 A.

Switching frequency up to 10 MHz.

Given the high BUS input voltage, the MOSFET technology is selected for the power transistor. This technology also offers a greater choice of transistors that are not impedance matched. Furthermore, MOSFETs are known to be more stable than bipolar transistors and this is an important factor in this strong signal application. To give a comparative idea of efficiency, bipolar transistors have a Vcesat in the order of 1.5 V whereas the RDSon of RF MOSFETs is in the order of 1 Ω to 2 Ω. This indicates that the power loss is comparable for a current less than 1 A.

Because of the high level signals, the MOSFETs chosen must have the minimum Cgs and Cds capacitance values. This is to minimize control energy and to ensure fast switching over a wide range of loads.

The transistors selected and their main characteristics are indicated below:

| TYPE | MANU-FACTURER | CHARACTERISTICS | | |
|---|---|---|---|---|
| | | Vds (V) | Id (A) | Co (PF) |
| MRF 175 LU | MOTOROLA | 65 | 13 | 200 |
| DU 2810S-N | MACOM | 65 | 2.8 | 10 |
| BLF 145 | PHILIPS | 65 | 6 | 75 |
| BLF 346 | PHILIPS | 65 | 13 | 180 |

The transistor offering the best characteristics is the MACOM DU 2810S-N, followed by the PHILIPS BLF 145. These two transistors have the further advantage of using the same encapsulation and the same pin-out.

The bipolar transistors control the MOSFETs. They must also meet the voltage, current and switching speed constraints imposed by the circuit.

The characteristics of the bipolar transistors used are as follows:

| TYPE | CHARACTERISTICS | | | |
|---|---|---|---|---|
| | Vceo | Vcbo | Ic | $f_T$ |
| 2N3866 (NPN) | 30 V | 55 V | 0.4 A | 800 MHz |
| 2N5160 (PNP) | 40 V | 60 V | 0.4 A | 900 MHz |

The circuits must use the transistors within their Vcbo characteristics in order to take advantage of the high voltage rating offered.

The base-emitter junction turn-off voltage is negative for NPN transistors and positive for PNP transistors.

At the frequencies at which the modulator operates, the important criterion for choosing the diode is the minimum recovery time.

As the operating frequency is around 10 MHz, representing a period of 100 ns, the recovery time must be less than 10 ns.

The diode chosen is a HEWLETT PACKARD 5082-3041 PIN diode which has a maximal $t_{rr}$ of 10 ns with a carrier lifetime of 15 ns; the maximal dissipation of this diode is 1 W.

A Schottky diode can be used for lower direct currents (<100 mA).

To smooth the output currents sufficiently the output inductance of the modulator filter must be greater than or equal to 3 μH, assuming a simple second order filter.

At the operating frequencies used, an inductance of this magnitude has to be a ferrite component. As the current flowing through the inductance is high (>1 A), iron powder devices are selected for their high saturation.

The device chosen is a MICROMETALS T37-6 toroid which has a maximum Qo at around 10 MHz and an AL of 3 $nH/N^2$.

The required inductance necessitates 32 turns.

For a current of 1 A the field H is then 17.4 Oersteds. This magnetic field does not induce any variation of self-inductance with this material.

TDK molded SMC inductors could be used instead. The NLC565050T-1 Rok series offers an inductance of 1 μH for a maximal DC current of 1.8 A and a resonant frequency of 170 MHz.

The criterion determining the choice of capacitors is the capacitance of the input filter. This must produce high current peaks at the switching frequency of the modulator. Its resonant frequency must therefore be higher than the latter.

Multilayer ceramic capacitors are chosen for their high rms currents. The AMERICAN TECHNICAL CERAMICS ATC 100–900 series is well suited to this application. The ATC 900 series offers capacitances in excess of 100 nF for resonant frequencies in excess of 10 MHz.

Figure 3:
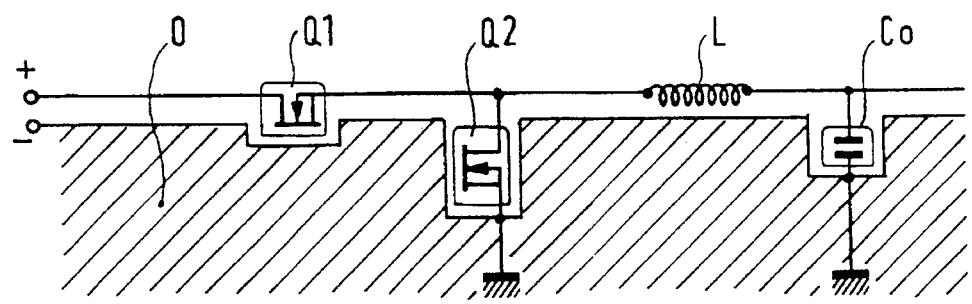
FIG. 3 is a diagram showing the isolation of power components and switching components from each other in accordance with the invention by means of metalization on a printed circuit.
Figure 4:
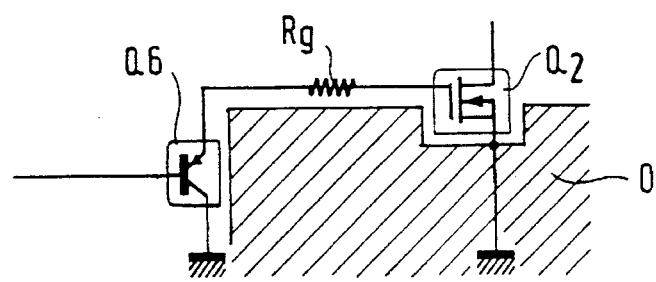
FIG. 4 is a diagram showing a different arrangement of components isolated by metalization on the printed circuit in accordance with one feature of the invention.

FIGS. 3 and 4 are diagrams showing one preferred embodiment of a modulator circuit of the invention in which the power and switching components are isolated from each other by metalization on the printed circuit which partly surrounds the components.

This arrangement eliminates interference which could otherwise restrict the increase in the switching frequency.

In the example shown in these two figures the modulator is wired on a double-sided polyimide printed circuit.

The loops in which currents are switched must be minimized.

The components are surface mount components (SMC) because of their small size. The electrical lengths must be minimized.

In FIG. 3, the power transistor Q1 is isolated from the transistor Q2 and from the capacitor Co by metalization 0 that is grounded.

Likewise, in FIG. 4, the transistor Q6 is isolated from the transistor Q2 by metalization 0 which is also grounded.

The example of a modulator circuit of the invention implemented on the principles shown hereinabove yields performance that is particularly advantageous as compared to that obtained by prior art modulator circuits.

The object of the invention is to transmit amplitude modulation of a signal having a bandwidth of several MHz, to transmit a high power, up to around 100 Watts, with high efficiency (>80%) and to obtain a deterministic and stationary interference spectrum enabling easy filtering out of interference and making the signal/noise ratio independent of the modulator load conditions.

In the field of energy conversion, the invention provides a very fast power modulator enabling the use of state control to implement very small converters, of high efficiency and with ultra short rise and fall times (<100 ns) for applications in active array antennas.

Figure 5:
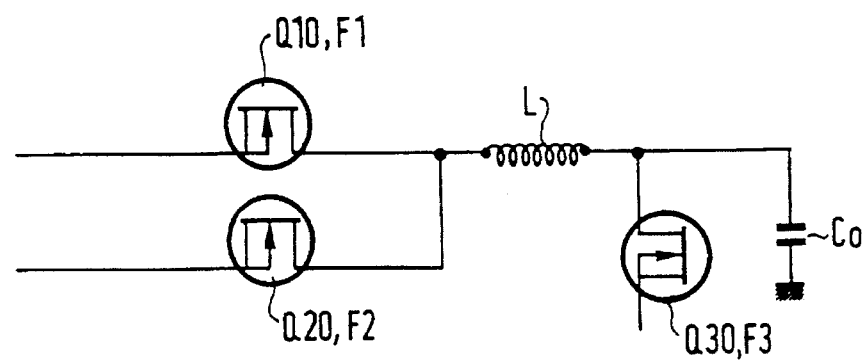
FIG. 5 shows an alternative embodiment of part of a modulator circuit in accordance with the invention enabling the switching frequency to be doubled.

FIG. 5 is a diagram showing the principle of one variant of the invention which doubles the switching frequency.

Figure 6:
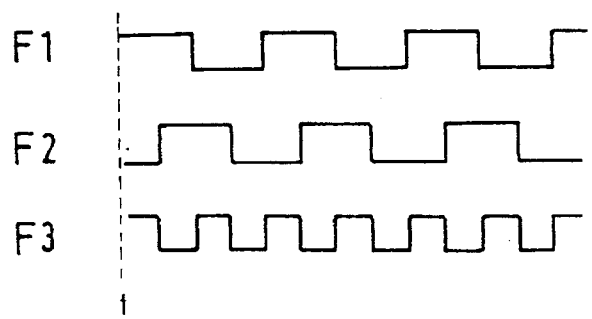
FIG. 6 is a timing diagram showing how the circuit from FIG. 5 doubles the frequency.

It is possible to increase the apparent switching frequency, and therefore the bandwidth transmitted, by coupling a plurality of stages with a relative phase-shift at a lower switching frequency, as shown in FIGS. 5 and 6 (multiplication by two).

FIG. 6 is a timing diagram for the FIG. 5 circuit.

The transistor Q10 is driven by a signal at frequency $F_1$ and the transistor Q20 is driven by a signal at frequency $F_2=F_1+\pi/2$ (frequencies F1 and F2 are the same, with a phase difference of $\pi/2$). The transistor Q30 is driven at the frequency $F_3=2F_1=2F_2$.

The apparent switching frequency at the output is thus doubled.

Measurements taken from an implementation in accordance with the invention as described above indicate the main aspects of the performance obtained with a modulator of the invention.

SUMMARY OF MEASUREMENTS

| duty cycle (%) | 90 | 90 | 90 | 50 |
|---|---|---|---|---|
| BUS voltage (V) | 20 | 30 | 40 | 30 |
| BUS current (mA) | 603 | 866 | 1110 | 420 |
| 10 V voltage (V) | 10 | 10 | 10 | 10 |
| 10 V current (mA) | 56 | 57 | 61 | 102 |
| output current (mA) | 607 | 880 | 1120 | 490 |
| efficiency (%) | 79.8 | 80.5 | 79.6 | 47.2 |

The measurement results show that the target maximum efficiency of 80% is achieved for a duty cycle of 90%.

The various measurements show that it is possible to develop modulators of this type with a high switching frequency. The modulator was tested at frequencies up to 10 MHz with no deterioration in performance. The only modifications that occur are a limitation in the dynamic range of the duty cycle and a higher resonant frequency of the MOSFET voltage Vds.

Note that optimizing the size of the printed circuit should substantially improve the various waveforms at the terminals of the modulator components and improve performance as a function of the switching frequency.

Other implementations and variants of the invention and its principles will readily suggest themselves to the person skilled in the art, without exceeding the scope of the invention.

For example, one variant is to use the same type of component for the various prior art converter structures: Boost, Buck-Boost, Push-Pull, Flyback, Forward, Cuk.

There is claimed:

1. Pulse width modulation type power supply modulator adapted to operate at high switching frequencies, including:

a power circuit including at least one power transistor, and a first control circuit connected to the gate of said power transistor, a second control circuit connected to the output of said power circuit, wherein said power circuit includes n power transistors each driven by a control signal supplied by a respective control circuit at a respective frequency, said frequencies being of the same value but of different phases, so as to satisfy the equation:

$$F_{i+1} = F_i + \frac{\pi}{n}, i = 1, \ldots n-1,$$

the result of which is a switching frequency given by the equation:

$$F_{n+1} = nF_1.$$

2. Modulator according to claim 1 wherein n=2 in order to satisfy the equation:

$$F2 = F1 + \frac{\pi}{n}, F_3 = 2F_1 = 2F_2,$$

the result of which is to double the switching frequency.

3. Modulator according to claim 1 wherein said first control circuit is a bootstrap circuit.

4. Modulator according to claim 1 comprising surface mount components on a polyimide substrate printed circuit.

5. Modulator according to claim 4 wherein said printed circuit is double-sided and metalization areas separate the active components in order to minimize unwanted coupling between them, said metalization being grounded.

6. Modulator according to claim 1 including as few resonant components as possible.

* * * * *